(12) United States Patent
Chen et al.

(10) Patent No.: US 8,070,879 B2
(45) Date of Patent: *Dec. 6, 2011

(54) APPARATUS AND METHOD FOR HYBRID CHEMICAL PROCESSING

(75) Inventors: Ling Chen, Sunnyvale, CA (US); Vincent W. Ku, San Jose, CA (US); Mei Chang, Saratoga, CA (US); Dien-Yeh Wu, San Jose, CA (US); Hua Chung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

This patent is subject to a terminal disclaimer.

(21) Appl. No.: 12/544,729

(22) Filed: Aug. 20, 2009

(65) Prior Publication Data

US 2009/0308318 A1 Dec. 17, 2009

Related U.S. Application Data

(63) Continuation of application No. 12/172,092, filed on Jul. 11, 2008, now Pat. No. 7,591,907, which is a continuation of application No. 11/680,995, filed on Mar. 1, 2007, now Pat. No. 7,402,210, which is a continuation of application No. 10/712,690, filed on Nov. 13, 2003, now Pat. No. 7,204,886.

(60) Provisional application No. 60/426,134, filed on Nov. 14, 2002.

(51) Int. Cl.
*C23C 16/455* (2006.01)
*C23F 1/00* (2006.01)
*H01L 21/306* (2006.01)
*C23C 16/34* (2006.01)

(52) U.S. Cl. ............. 118/715; 156/345.29; 156/345.35; 118/723 IR; 118/723 ER; 118/723 ME

(58) Field of Classification Search .................. 118/715, 118/723 IR, 723 ER, 723 ME; 156/345.29, 156/345.35
See application file for complete search history.

(56) References Cited

U.S. PATENT DOCUMENTS
4,761,269 A * 8/1988 Conger et al. ............... 118/679
(Continued)

FOREIGN PATENT DOCUMENTS
JP 04087323 A 3/1992
(Continued)

OTHER PUBLICATIONS
Notice to File a Response issued Dec. 16, 2010 in Korean Application No. 10-2003-0080486.
(Continued)

*Primary Examiner* — Rudy Zervigon
(74) *Attorney, Agent, or Firm* — Patterson & Sheridan, L.L.P.

(57) ABSTRACT

In one embodiment, an apparatus for performing an atomic layer deposition (ALD) process is provided which includes a chamber body containing a substrate support, a lid assembly attached to the chamber body, a remote plasma system (RPS) in fluid communication with the reaction zone, a centralized expanding conduit extending through the lid assembly and expanding radially outwards, a first gas delivery sub-assembly configured to deliver a first process gas, and a second gas delivery sub-assembly configured to deliver a second process gas into the centralized expanding conduit. The first gas delivery sub-assembly contains an annular channel encircling and in fluid communication with the centralized expanding conduit, wherein the annular channel is adapted to deliver the first process gas through a plurality of passageways and nozzles and into the centralized expanding conduit. The second gas delivery sub-assembly contains a gas inlet in fluid communication to the centralized expanding conduit.

11 Claims, 9 Drawing Sheets

U.S. PATENT DOCUMENTS

| | | | |
|---|---|---|---|
| 4,825,809 A | 5/1989 | Mieno et al. | |
| 4,975,252 A | 12/1990 | Nishizawa et al. | |
| 5,024,748 A * | 6/1991 | Fujimura | 204/298.38 |
| 5,178,681 A | 1/1993 | Moore et al. | |
| 5,887,117 A * | 3/1999 | Desu et al. | 392/386 |
| 5,935,490 A * | 8/1999 | Archbold et al. | 261/76 |
| 5,972,430 A | 10/1999 | DiMeo, Jr. et al. | |
| 6,001,267 A * | 12/1999 | Os et al. | 216/67 |
| 6,161,500 A * | 12/2000 | Kopacz et al. | 118/723 E |
| 6,258,170 B1 * | 7/2001 | Somekh et al. | 118/715 |
| 6,302,965 B1 * | 10/2001 | Umotoy et al. | 118/715 |
| 6,756,235 B1 * | 6/2004 | Liu et al. | 438/3 |
| 6,875,271 B2 | 4/2005 | Glenn et al. | |
| 6,878,206 B2 | 4/2005 | Tzu et al. | |
| 6,916,398 B2 * | 7/2005 | Chen et al. | 156/345.33 |
| 6,921,062 B2 | 7/2005 | Gregg et al. | |
| 7,017,514 B1 * | 3/2006 | Shepherd et al. | 118/723 ME |
| 7,175,713 B2 * | 2/2007 | Thakur et al. | 118/715 |
| 7,204,886 B2 * | 4/2007 | Chen et al. | 118/715 |
| 7,228,873 B2 * | 6/2007 | Ku et al. | 137/624.11 |
| 7,252,716 B2 * | 8/2007 | Kim et al. | 118/715 |
| 7,264,846 B2 * | 9/2007 | Chang et al. | 427/248.1 |
| 7,402,210 B2 * | 7/2008 | Chen et al. | 118/715 |
| 7,408,225 B2 | 8/2008 | Shinriki et al. | |
| 7,591,907 B2 * | 9/2009 | Chen et al. | 118/715 |
| 2001/0042523 A1 | 11/2001 | Kesala | |
| 2002/0009896 A1 | 1/2002 | Sandhu et al. | |
| 2002/0076507 A1 | 6/2002 | Chiang et al. | |
| 2002/0110991 A1 | 8/2002 | Li | |
| 2003/0019428 A1 * | 1/2003 | Ku et al. | 118/715 |
| 2003/0079686 A1 * | 5/2003 | Chen et al. | 118/715 |
| 2003/0082301 A1 * | 5/2003 | Chen et al. | 427/255.28 |
| 2003/0082307 A1 * | 5/2003 | Chung et al. | 427/402 |
| 2003/0101938 A1 | 6/2003 | Ronsse et al. | |
| 2003/0106490 A1 * | 6/2003 | Jallepally et al. | 117/89 |
| 2003/0108674 A1 * | 6/2003 | Chung et al. | 427/255.394 |
| 2003/0116087 A1 | 6/2003 | Nguyen et al. | |
| 2003/0121608 A1 * | 7/2003 | Chen et al. | 156/345.33 |
| 2003/0124262 A1 * | 7/2003 | Chen et al. | 427/404 |
| 2003/0129308 A1 * | 7/2003 | Chen et al. | 427/255.28 |
| 2003/0198740 A1 | 10/2003 | Wendling | |
| 2003/0203616 A1 * | 10/2003 | Chung et al. | 438/627 |
| 2004/0009336 A1 * | 1/2004 | Marcadal et al. | 428/210 |
| 2004/0009665 A1 * | 1/2004 | Chen et al. | 438/687 |
| 2004/0011504 A1 | 1/2004 | Ku et al. | |
| 2004/0048461 A1 * | 3/2004 | Chen et al. | 438/629 |
| 2004/0069227 A1 * | 4/2004 | Ku et al. | 118/721 |
| 2004/0077183 A1 * | 4/2004 | Chung | 438/785 |
| 2004/0187304 A1 * | 9/2004 | Chen et al. | 29/830 |
| 2004/0241321 A1 * | 12/2004 | Ganguli et al. | 427/255.28 |
| 2004/0256351 A1 * | 12/2004 | Chung et al. | 216/13 |
| 2004/0266175 A1 * | 12/2004 | Chen et al. | 438/629 |
| 2005/0008779 A1 | 1/2005 | Yang et al. | |
| 2005/0009325 A1 * | 1/2005 | Chung et al. | 438/637 |
| 2005/0011555 A1 * | 1/2005 | Maula et al. | 137/341 |
| 2005/0173068 A1 | 8/2005 | Chen et al. | |
| 2005/0257735 A1 | 11/2005 | Guenther | |
| 2007/0003698 A1 | 1/2007 | Chen et al. | |
| 2007/0044719 A1 | 3/2007 | Ku et al. | |
| 2007/0095285 A1 | 5/2007 | Thakur et al. | |
| 2008/0274299 A1 | 11/2008 | Chen et al. | |

FOREIGN PATENT DOCUMENTS

| | | |
|---|---|---|
| JP | 07-115064 A | 5/1995 |
| JP | 10247627 A | 9/1998 |
| JP | 11054459 A | 2/1999 |
| JP | 2000248361 A | 9/2000 |
| JP | 2001507757 T | 6/2001 |
| JP | 2002009078 A | 1/2002 |
| JP | 2002-252219 A | 9/2002 |

OTHER PUBLICATIONS

Office Action dated Apr. 6, 2010 for Japanese Patent Application No. 2003-384954.

* cited by examiner

APPARATUS AND METHOD FOR HYBRID CHEMICAL PROCESSING

CROSS-REFERENCE TO RELATED APPLICATIONS

This application is a continuation of U.S. Ser. No. 12/172,092, filed Jul. 11, 2008, now U.S. Pat. No. 7,591,907 which is a continuation of U.S. Ser. No. 11/680,995, filed Mar. 1, 2007, and issued as U.S. Pat. No. 7,402,210, which is a continuation of U.S. Ser. No. 10/712,690, filed Nov. 13, 2003, and issued as U.S. Pat. No. 7,204,886, which claims benefit of U.S. Ser. No. 60/426,134, filed Nov. 14, 2002, which are herein incorporated by reference in their entirety.

BACKGROUND OF THE INVENTION

1. Field of the Invention

Embodiments of the invention generally relate to an apparatus and method for performing multiple vapor deposition processes in-situ. More particularly, embodiments of the invention relate to an improved gas delivery apparatus and method for depositing films in-situ using both cyclical layer and chemical vapor deposition techniques.

2. Description of the Related Art

Sub-quarter micron multilevel metallization is one of the key technologies for the next generation of very large scale integration (VLSI). The multilevel interconnects that lie at the heart of this technology possess high aspect ratio features, including contacts, vias, lines, or other apertures. Reliable formation of these features is very important to the success of VLSI and to the continued effort to increase quality and circuit density on individual substrates. Therefore, there is a great amount of ongoing effort being directed to the formation of void-free features having high aspect ratios of 4:1 (height:width) or greater.

Copper has recently become a choice metal for filling VLSI features, such as sub-micron high aspect ratio, interconnect features, because copper and its alloys have lower resistivities than aluminum. However, copper and its alloys have a propensity to diffuse into surrounding materials such as silicon oxide, silicon, and other dielectric materials for example, causing an increase in the contact resistance of the circuit. Copper and its alloys also have a propensity to diffuse into surrounding elements such as transistor gates, capacitor dielectrics, transistor wells, transistor channels, electrical barrier regions, interconnects, among other known elements of integrated circuits. Barrier layers are, therefore, deposited prior to copper metallization to prevent or impede the diffusion of copper atoms.

A typical sequence for forming an interconnect includes depositing one or more non-conductive layers, etching at least one of the layer(s) to form one or more features therein, depositing a barrier layer in the feature(s) and depositing one or more conductive layers, such as copper, to fill the feature. The barrier layer typically includes a refractory metal such as tungsten, titanium, tantalum, and nitrides thereof. Of this group, tantalum nitride is one of the most desirable elements for use as a barrier layer because it has one of the lowest resistivities of the refractory metal nitrides and makes a good adhesion layer for copper metallization. A refractory metal nitride layer, such as tantalum nitride, is typically deposited using conventional deposition techniques, such as physical vapor deposition (PVD) and chemical vapor deposition (CVD).

Conventional deposition processes have difficulty forming interconnect structures because these processes have problems filling sub-micron structures where the aspect ratio exceeds 4:1, and particularly where the aspect ratio exceeds 10:1. Often, the barrier layer bridges the opening of a narrow feature, resulting in the formation of one or more voids or discontinuities within the feature. Since voids increase the resistance and reduce the electromigration resistance of the feature, features having voids make poor and unreliable electrical contacts.

Atomic layer deposition (ALD) is one deposition technique being explored to deposit materials, such as a barrier layer, over features having high aspect ratios. ALD involves the sequential introduction of separate pulses of a first reactant and a second reactant, resulting in a self-limiting absorption of monolayers of material on the substrate surface. The reactants are sequentially introduced until a desired thickness of the deposited material is deposited. A pulse of a purge gas and/or a pump evacuation between the pulses of the reactants serves to reduce the likelihood of gas phase reactions of the reactants due to excess amounts of the reactants remaining in the chamber.

Often within a typical fabrication sequence, a processed wafer is transferred between various processing chambers, consuming valuable processing time. Sometimes, the process wafer is subjected to a vacuum break between processing chambers and thus, the substrate is exposed to ambient conditions which, among other things, leads to oxidation of the substrate surface. Like voids, metal oxides increase the resistance of the interconnect and reduce the electromigration resistance of vias and small features. Metal oxides also become a source of particle problems and reduce the reliability of the overall circuit. Metal oxides may also interfere with subsequent deposition processes by creating voids that promote uneven distribution of a subsequent depositing layer.

There is a need, therefore, for a new method and apparatus for depositing multiple layers of material in-situ using multiple deposition techniques. Such a new method and apparatus would eliminate the need to transfer substrates between various processing chambers, and would reduce the likelihood of void formation.

SUMMARY OF THE INVENTION

An apparatus capable of performing multiple deposition processes is provided. In one embodiment, the apparatus includes a chamber body and a gas distribution assembly disposed on the chamber body. In one aspect of this embodiment, the gas distribution assembly includes a gas conduit in fluid communication with the chamber body, two or more isolated gas inlets equipped with one or more high speed actuating valves in fluid communication with the gas conduit, and a mixing channel in fluid communication with the gas conduit. The valves are adapted to alternately pulse two or more compounds into the gas conduit, and the mixing channel is adapted to deliver a continuous flow of one or more compounds into the gas conduit.

In another aspect of this embodiment, the gas distribution assembly comprises a gas conduit in fluid communication with the chamber body, at least two separate flow paths in fluid communication with the gas conduit at a first end thereof, and at least one annular mixing channel disposed about the gas conduit at a second end thereof. Each isolated flow path comprises one or more high speed actuating valves, and the mixing channel is in fluid communication with the gas conduit via a plurality of nozzles formed therethrough. The flow paths are isolated from the mixing channel by a pressure differential created within the gas distribution assembly.

A method for depositing multiple layers on a substrate surface by performing multiple deposition processes within a single processing chamber is also provided. In one aspect, the method comprises positioning a substrate surface to be processed within a chamber body, delivering two or more compounds into the chamber body utilizing a gas distribution assembly disposed on the chamber body to deposit a film comprising a first material, and then delivering two or more compounds into the chamber body utilizing a gas distribution assembly disposed on the chamber body to deposit a film comprising a second material. The gas distribution assembly comprises a gas conduit in fluid communication with the chamber body, at least two isolated flow paths in fluid communication with the gas conduit at a first end thereof, and at least one annular mixing channel disposed about the gas conduit at a second end thereof. Each isolated flow path comprising one or more high speed actuating valves that are adapted to alternately pulse the two or more compounds into the gas conduit. The mixing channel is in fluid communication with the gas conduit via a plurality of nozzles formed therethrough, and is adapted to deliver a continuous flow of the two or more compounds into the gas conduit.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and therefore, are not to be considered limiting of its scope, for the invention may admit to other equally effective embodiments.

DETAILED DESCRIPTION

Figure 1:
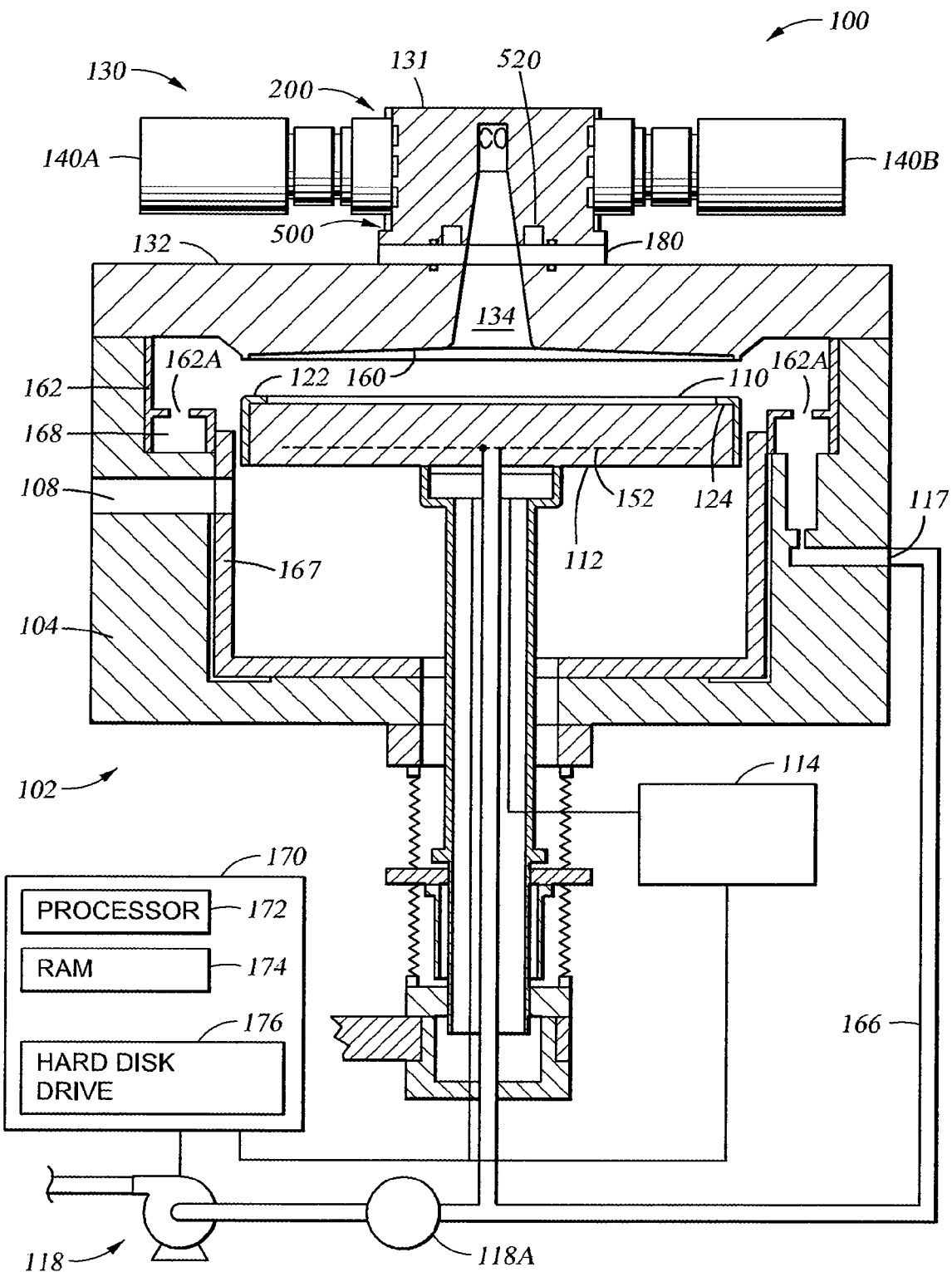
FIG. 1 is a schematic, cross-sectional view of a processing system 100 capable of performing both a cyclical layer deposition process and a chemical vapor deposition process according to embodiments of the invention.

FIG. 1 is a schematic, cross-sectional view of a processing system 100 capable of depositing various materials, films, and layers on a work piece surface using multiple deposition techniques. The processing system 100 includes a gas delivery system 130 disposed on an upper portion of a chamber body 102. The chamber body 102 includes a pumping plate 162, a liner 167, a slit valve 108, and a substrate support 112 disposed therein. The slit valve 108 is formed within a side wall 104 of the chamber body 102 and allows transfer of a workpiece (not shown) to and from the interior of the chamber body 102 without compromising the fluid-tight seal formed between the gas delivery system 130 and the chamber body 102. Any conventional workpiece transfer assembly (not shown) may be used, such as a robotic wafer transfer assembly, for example. One example of a conventional robotic wafer transfer assembly is described in the commonly assigned U.S. Pat. No. 4,951,601, which is incorporated by reference herein.

The substrate support 112 is mounted to a lift motor 114 to raise and lower the substrate support 112 and a substrate 110 disposed thereon. The substrate support 112 may also include a vacuum chuck, an electrostatic chuck, or a clamp ring (not shown) for securing the substrate 110 to the substrate support 112 during processing. The substrate support 112 may be heated using an embedded heating element 152, such as a resistive heater, or may be heated using radiant heat, such as heating lamps (not shown) disposed above the substrate support 112. A purge ring 122 may be disposed on the substrate support 112 to define a purge channel 124 where a purge gas is provided to prevent deposition on a peripheral portion of the substrate 110.

The liner 167 is disposed about the substrate support 112 and circumscribes the interior, vertical surfaces of the chamber body 102. The liner 167 is constructed of any process compatible material, such as aluminum, and is preferably made of the same material as the chamber body 102. A purge channel 168 is formed within the liner 167 and is in fluid communication with a pumping port 117 that extends through a side wall of the chamber body 102. A pump system 118 is connectable to the chamber body 102 adjacent the pumping port 117, and helps direct the flow of fluids within the chamber body 102.

The pumping plate 162 defines an upper surface of the purge channel 168 and controls the flow of fluid between the chamber body 102 and the pumping port 117. The pumping plate 162 is an annular member having a plurality of apertures 162A formed therethrough. The diameter, number, and position of apertures 162A formed in the pumping plate 162 restrict the flow of gases exiting the chamber body 102 thereby containing the gases in contact with the substrate 110 disposed within the chamber body 102. The apertures 162A provide consistent and uniform deposition on the workpiece.

Since the volume of the purge channel 168 is not consistent around the perimeter of the chamber body 102, the diameter, number, and position of apertures 162A are strategically arranged about the pumping plate 162. For example, the purge channel 168 has a smaller cross sectional area around the slit valve 108 to accommodate the transfer of the workpieces in and out of the chamber body 102. Accordingly, the size, orientation, and number of apertures 162A must be specifically designed and engineered so that uniform fluid flow about the perimeter and surface of the workpiece is achieved.

A pump system 118 is connectable to the chamber body 102 at the pumping port 117, and helps direct the flow of fluids within the chamber body 102. The pump system 118 evacuates gases from the chamber body 102 and helps maintain a desired pressure or a desired pressure range within the processing system 100. The purge channel 168 is coupled to the pump system 118 via a conduit 166 and a throttle valve 118A. The purge channel 168, throttle valve 118A, and pump system 118 work together to control the gas flow within the processing system 100.

The processing system 100 may further include a remote plasma source (not shown) to clean contaminants or particles formed on interior surfaces thereof. A plasma of reactive species may be generated by applying an electric field to a process gas, such as hydrogen, nitrogen, oxygen-containing compounds, fluorine-containing compounds, and mixtures thereof, for example, within the remote plasma source. Typically, the electric field is generated by a RF or microwave power source (not shown). The reactive species are then introduced into the processing system 100 to reactively clean and remove unwanted particles.

Furthermore, the processing system 100 may be integrated into an integrated processing platform, such as an ENDURA® platform available from Applied Materials, Inc. Details of the ENDURA® platform are described in commonly assigned U.S. Ser. No. 09/451,628, entitled "Integrated Modular Processing Platform," filed on Nov. 30, 1999, which is incorporated by reference herein.

Still referring to FIG. 1, the gas delivery system 130 includes a head assembly 131 and a thermal insulating plate 180 disposed on a chamber lid 132, each having at least a portion of an expanding conduit 134 formed therethrough. A lower surface 160 of the chamber lid 132 includes a gradual, tapering slope/recess that extends from a central portion thereof, adjacent the expanding conduit 134, to a peripheral portion thereof. The recess formed on the lower surface 160 is sized and shaped to substantially cover the substrate 110 disposed below. It is believed that the tapered lower surface 160 provides a more uniform deposition of the gas across the surface of the substrate 110. The tapered surface 160 creates a more uniform velocity, thereby delivering a uniform concentration of gas across the surface of the substrate 110.

Figure 2:
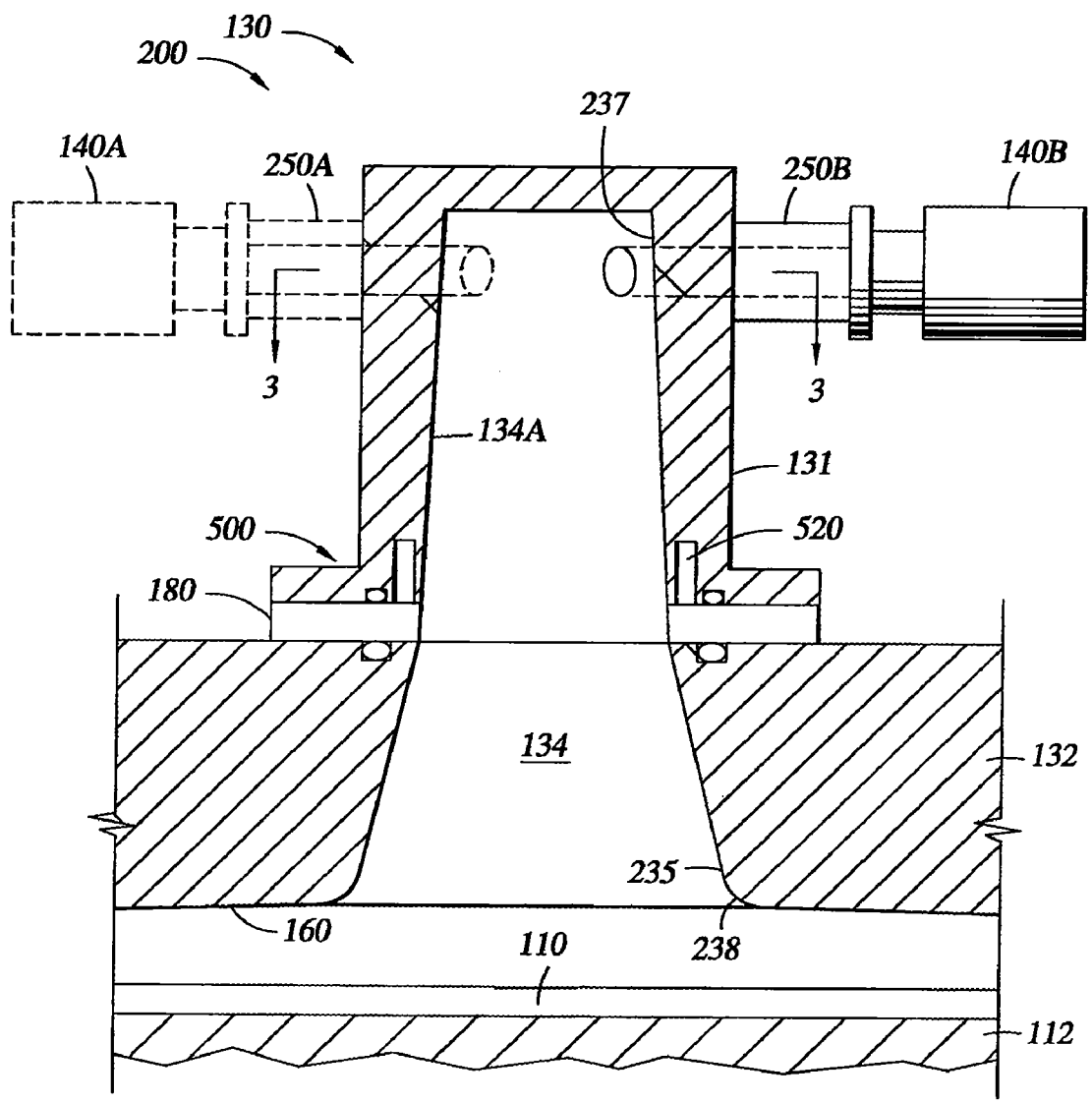
FIG. 2 is an enlarged, partial cross-sectional view of the gas delivery system 130.

FIG. 2 shows an enlarged, partial cross-sectional view of the gas delivery system 130. The expanding conduit 134 including an inner diameter of inner wall 134A that gradually increases from an upper portion 237 thereof to a lower portion 235 thereof. The expanding conduit 134 may include one or more tapered inner surfaces, such as a straight tapered surface, a concave surface, a convex surface, or combinations thereof. The expanding conduit 134 may also include sections of one or more tapered inner surfaces, such as a first tapered portion and a second non-tapered portion, for example. In one aspect, the inner diameter of inner wall 134A of the expanding conduit 134 is a straight tapered surface that gradually increases from the upper portion 237 thereof to the lower portion 235 thereof. The lower portion 235 of the expanding conduit 134 is adjacent the lower surface 160 of the chamber lid 132, and is chamfered/smoothed at a lower edge 238 thereof to minimize stagnation in the gas flow. In one aspect, the inner diameter of inner wall 134A may be between about 0.2 inches and about 1.0 inches at the upper portion 237 and between about 0.5 inches and about 3.0 inches at the lower portion 235. These dimensions are provided for illustrative purpose only, and are known to accommodate a total gas flow between about 500 sccm and about 3,000 sccm. Of course, the specific dimensions can be modified to accommodate any gas flow therethrough.

The gas delivery system 130 also includes at least one first gas delivery sub-assembly 200 and at least one second gas delivery sub-assembly 500 disposed about the head assembly 131. Both gas delivery sub-assemblies 200, 500 are in fluid communication with the expanding conduit 134. The first gas delivery system 200 includes at least two high speed actuating valves (two are shown 140A, 140B), to regulate the flow of gases from their respective sources (not shown) into the expanding conduit 134. The second gas delivery system 500 is disposed proximate the lower portion 235 of the expanding conduit 134, and is described in more detail below with reference to FIG. 5.

Regarding the first gas delivery system 200 in more detail, each valve 140A, 140B has two or more ports, and is adapted to provide simultaneous gas flows and/or separate/alternating gas flows to the expanding conduit 134, depending on the mode of deposition. In one aspect, the valves 140A, 140B are three-way valves, each coupled to a separate reactant gas source (not shown), and to a common purge gas source (also not shown). In some instances, a carrier gas may be required to deliver one or more reactant gases. When this occurs, the same gas may be used as both the carrier gas and the purge gas. Suitable purge/carrier gases include hydrogen, nitrogen, helium, argon, and combinations thereof.

The valves 140A, 140B precisely and repeatedly deliver short pulses of one or more compounds into the chamber body 102. The valves 140A, 140B, may be any type of valve capable of reliably, repeatedly, and precisely metering the desired precursors at the desired rate of introduction. The on/off cycles or pulses of the valves 140A, 140B are less than about 100 milliseconds (msec). In some cases, dosing may be as fast as 1-2 msec. As one example, the valves 140A, 140B may be electronically controlled (EC) valves, such as those commercially available from Fujikin of Japan as part number FR-21-6.35 UGF-APD.

As shown in FIG. 2, each valve 140A, 140B is in fluid communication with the expanding conduit 134 via a delivery conduit 250A, 250B. The delivery conduits 250A, 250B may be machined as part of the valves 140A, 140B or the delivery conduits 250A, 250B may be manufactured as separate parts and assembled to the valves 140A, 140B. The length of the delivery conduits 250A, 250B are minimized to place the valves 140A, 140B in close proximity to the expanding conduit 134, reducing any unnecessary volume between the valves 140A, 140B and the expanding conduit 134. The proximity provides better control and operability during deposition.

Figure 3:
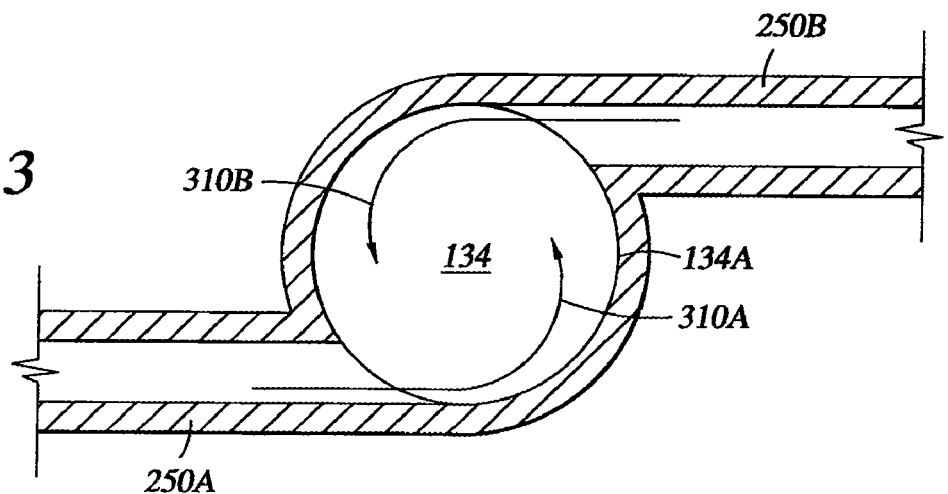
FIG. 3 is a top cross-sectional view of the gas delivery assembly 130 along lines 3-3 in FIG. 2.

FIG. 3 is a top cross-sectional view of the gas delivery assembly 130 along lines 3-3 in FIG. 2. The delivery conduits 250A, 250B, are positioned tangentially to expanding conduit 134. During use, a gas flowing through the delivery conduits 250A, 250B initially flows in a circular direction as shown by arrows 310A, 310B. Providing gas tangentially produces a circular, laminar flow through the expanding conduit 134, resulting in an improved flow distribution across the surface of the substrate 110 and an improved purge of the inner surface of the expanding conduit 134. In comparison, a turbulent flow may not uniformly flow within the expanding conduit 134 and may create areas within the expanding conduit 134 where there is no gas flow.

Figure 4:
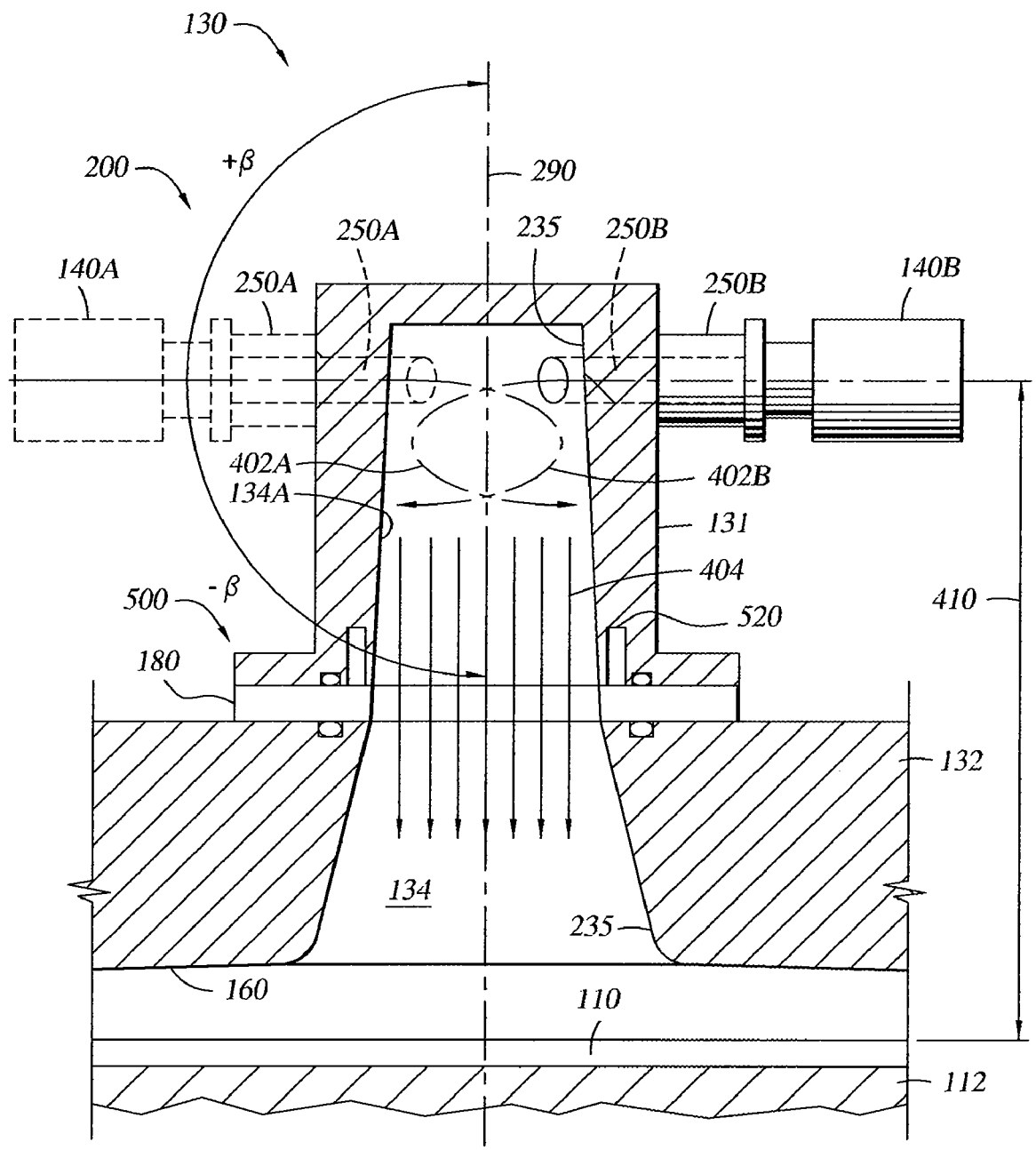
FIG. 4 is a schematic illustration of an exemplary flow regime through the gas delivery assembly 130.

FIG. 4 is a schematic illustration of an exemplary flow regime through the gas delivery assembly 130. As shown, the delivery conduits 250A, 250B are positioned in a relationship $(+\beta, -\beta)$ to a longitudinal axis 290 of the expanding conduit 134. Each delivery conduit 250A, 250B is positioned normal (in which $+\beta, -\beta=90°$) to the longitudinal axis 290 or positioned at an angle (in which $0°<+\beta<90°$ or $0°<-\beta<90°$) relative to the longitudinal axis 290. Regardless of the relationship $(+\beta, -\beta)$, the gas flows through the delivery conduits 250A, 250B into the inner wall 134A of the expanding conduit 134. The contact with the inner wall of the expanding conduit 134 slows the velocity of the gas, reducing the likelihood of blowing off reactants previously adsorbed/absorbed on the surface of the substrate 110. An inner diameter of the gas conduits 250A, 250B may also be increased to further reduce the velocity of the gas flow prior to entry into the expanding conduit 134.

Although the exact flow pattern through the expanding conduit 134 is not known, it is believed that the initial circular, laminar flow 310A, 310B (shown in FIG. 3) progresses into a laminar "vortex" or "spiral" flow pattern (represented by arrows 402A, 402B) as the gases travel through the expanding conduit 134. A distance 410 between the delivery conduits 250A, 250B and the substrate 110 is designed such that the vortex flow pattern 402A, 402B decreases in velocity such that a substantially vertical flow path is created. It is believed that the vortex flow pattern 402A, 402B provides superior mixing of the gases, if desired, and provides an efficient purge or sweep of the inner surface of the expanding conduit 134, whereas, the substantially vertical flow allows better deposition on the surface of the substrate 110. In one aspect, the expanding conduit 134 is mirror polished to help produce or encourage the laminar flow of gases therethrough.

A sudden adiabatic expansion of a gas delivered through the delivery conduits 250A, 250B into the expanding conduit 134 may result in a temperature drop that may cause condensation of the gas and formation of particles. Not wishing to be bound by theory, it is believed that the gradually increasing inner diameter of inner wall 134A of the expanding conduit 134 and the orientation of the delivery conduits 250A, 250B allows less of an adiabatic expansion of a gas through the expanding conduit 134. Therefore, the gas temperature is more easily controlled, preventing gas decomposition, deposition, and condensation on the chamber lid 132.

The gas temperature may be controlled by controlling the temperature of the chamber lid 132. The chamber lid 132 may include cooling elements and/or heating elements (not shown) depending on the particular deposition process and compounds being delivered therethrough. In one aspect, one or more water channels may be formed in the chamber lid 132. In another aspect, heating elements may be embedded or may surround components of the chamber lid 132. In another aspect, the chamber lid 132 may include both heating and cooling channels or elements to heat and/or cool various portions of the chamber lid 132. For example, a central portion of the chamber lid 132, proximate the expanding conduit 134, may be heated while a perimeter portion of the chamber lid 132 may be cooled.

Figure 5A:
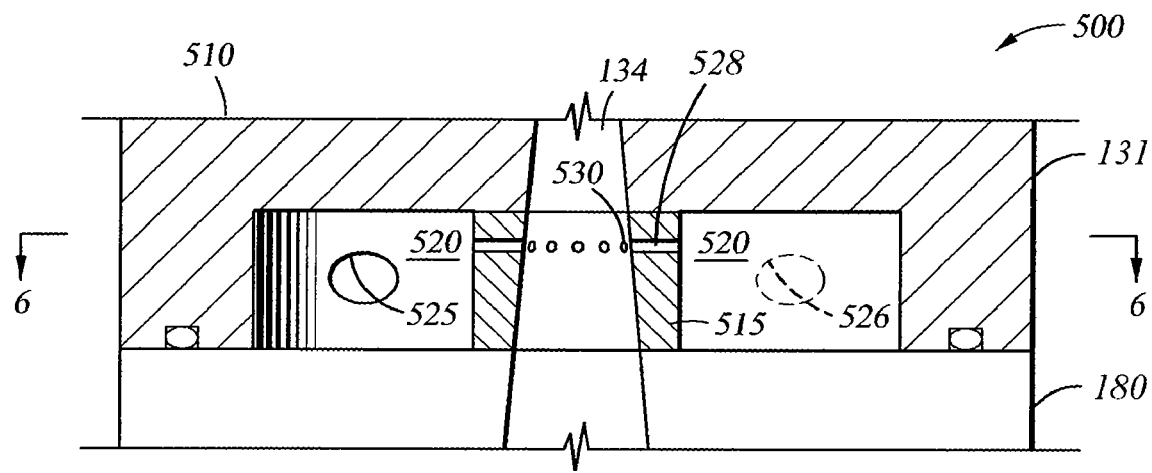
FIG. 5A is an enlarged vertical sectional view of one embodiment of the second gas delivery sub-assembly 500.

FIG. 5A shows an enlarged vertical sectional view of the second gas delivery sub-assembly 500. The second gas delivery sub-assembly 500 includes a radial mixer 510 having an annular mixing channel 520 formed therethrough. The annular mixing channel 520 is formed concentric with the expanding conduit 134. A volume of the annular mixing channel 520 depends on many factors, such as the precursor gases employed, the size of the chamber body 102, the size of the substrate 110 to be processed, the volume and dimensions of the expanding conduit 134, as well as the operating temperature, pressure, and flow rate of the gases used during deposition.

The radial mixer 510 has an inner wall 515 located between the expanding conduit 134 and the annular mixing channel 520. One or more passageways 528 having nozzles 530, are formed through the inner wall 515 to allow fluid communication between the annular mixing channel 520 and the expanding conduit 134. The nozzles 530 are disposed radially and are substantially evenly distributed along an outer circumference of the expanding conduit 134. The nozzles 530 may be disposed substantially normal to the expanding conduit 134. Alternatively, the nozzles 530 may be disposed at an angle relative to normal, such as between about −60° to about +60°. In one aspect, the number of nozzles 530 may be twelve; however, other numbers, shapes and/or distributions of nozzles 530 may also be employed.

At least one gas inlet (two gas inlets are shown 525, 526) is in communication with the annular mixing channel 520 from outside of the radial mixer 510. Typically, the gas inlets 525, 526, are in fluid communication with one or more sources (not shown) of reactant gases, precursor gases, carrier gases, purge gases, and any combination thereof. The gas inlets 525, 526, provide the one or more processing gases from their respective sources (not shown) to the annular mixing channel 520 where the gases mix prior to entering the expanding conduit 134 via the nozzles 530.

The gas inlets 525, 526 are oriented such that they are not directly aligned with any one of the nozzles 530. For instance, the gas inlets 525, 526 are offset relative to the nozzles 530 so that any one of the respective velocities of the gases emerging from any one of the gas inlets 525, 526 does not affect the local pressure of another. As a result, a thorough mixing of the gases is achieved within the annular mixing channel 520, and a substantially equal flow of gas enters the expanding conduit 134 through the nozzles 530.

Figure 5B:
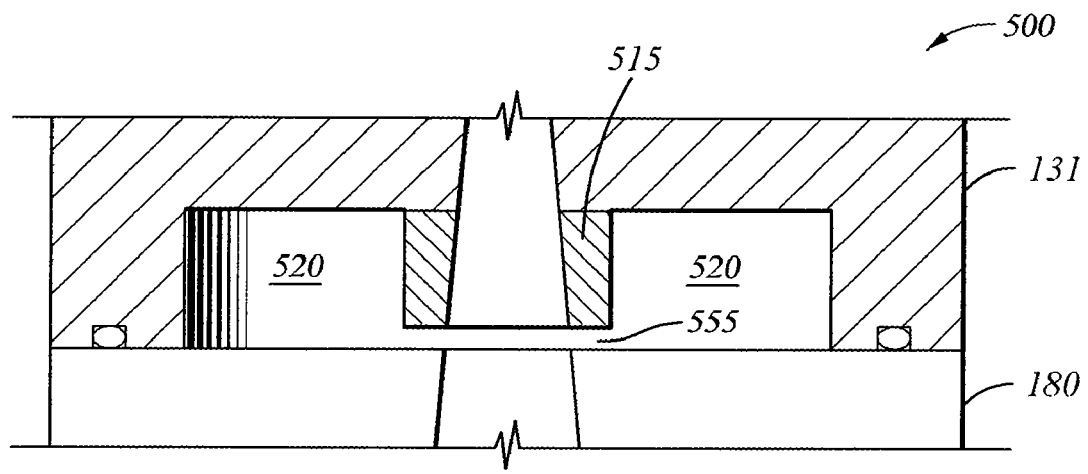
FIG. 5B is an enlarged vertical sectional view of another embodiment of the second gas delivery sub-assembly 500.

FIG. 5B shows an enlarged vertical sectional view of another embodiment of the second gas delivery sub-assembly 500. The second gas delivery sub-assembly 500 includes a gap or a passageway, such as gap 555, formed in a lower surface of the inner wall 515. Although not shown, it is contemplated to have both nozzles 530 and a gap 555 formed through the inner wall 515. In one aspect of this embodiment, the height of the gap 555 may be constant across the diameter of the inner wall 515. In another aspect of this embodiment, the height of the gap 555 may vary across the diameter of the inner wall 515 to compensate for the pumping effects created within the chamber body 102. For example, the height of the gap 555 nearest the pumping port 117 may be half the height of the gap 555 opposite the pumping port 117 to choke off the fluid flow where the pressure differential is the greatest. By changing the height of the gap 555, the fluid dynamics of the gas flowing through the annular mixing channel 520 can be better controlled to provide better mixing or better distribution through out the expanding conduit 134 and the chamber body 102.

Figure 6:
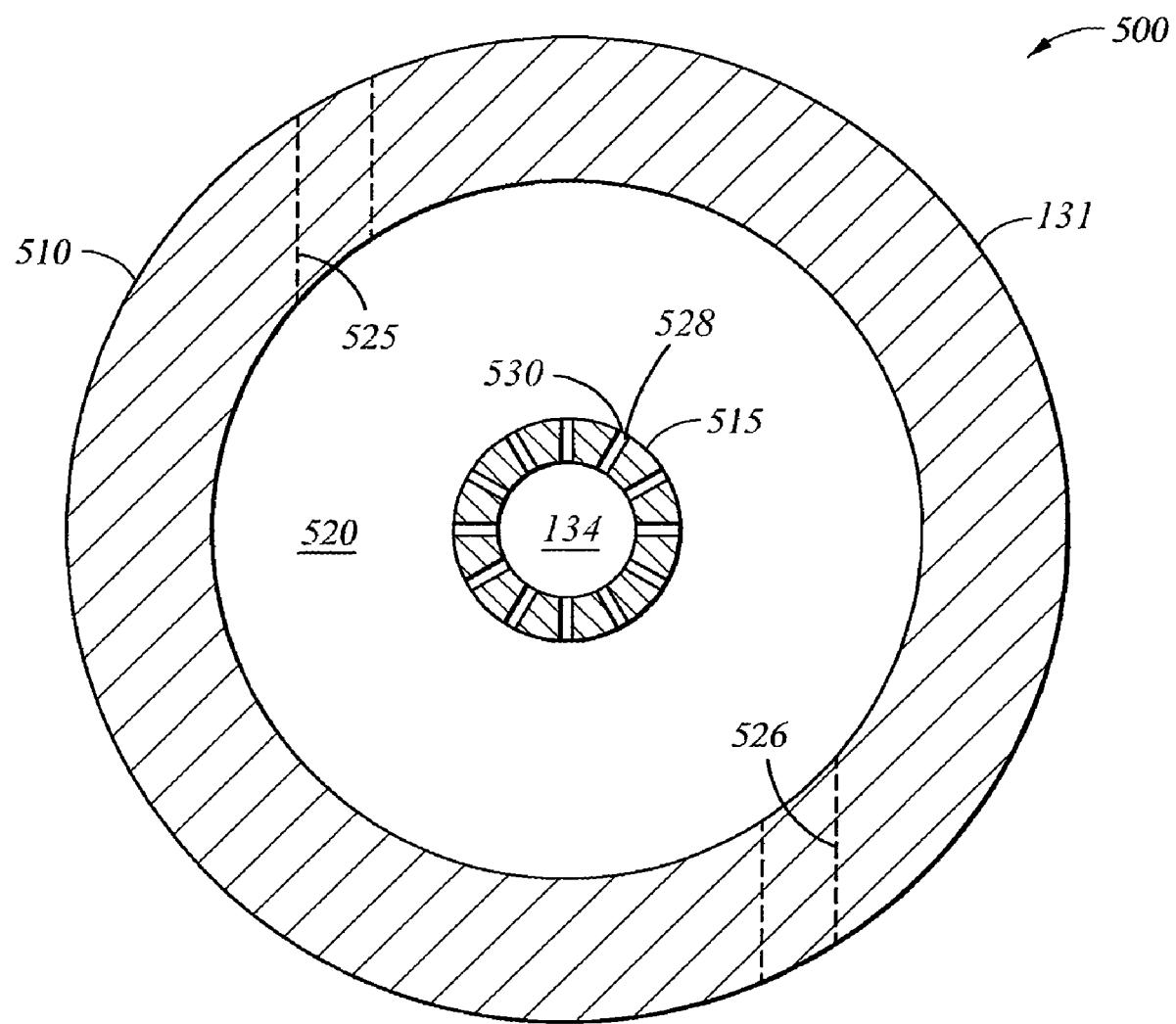
FIGS. 6 and 6A are schematic horizontal sectional views of the second gas delivery system 500 along line 6-6 of FIG. 5.

FIG. 6 is a schematic horizontal sectional view of the second gas delivery system 500 along line 6-6 of FIG. 5. The passageways 528 and nozzles 530 are arranged and dimensioned to provide substantial flow resistance to the gas flowing from the annular mixing channel 520 to the expanding conduit 134. The substantial resistance to gas flow provided by the nozzles 530 allows a substantially equal rate of flow to be achieved through each of the nozzles 530, providing a full and even flow distribution to the substrate 110.

Figure 6A:
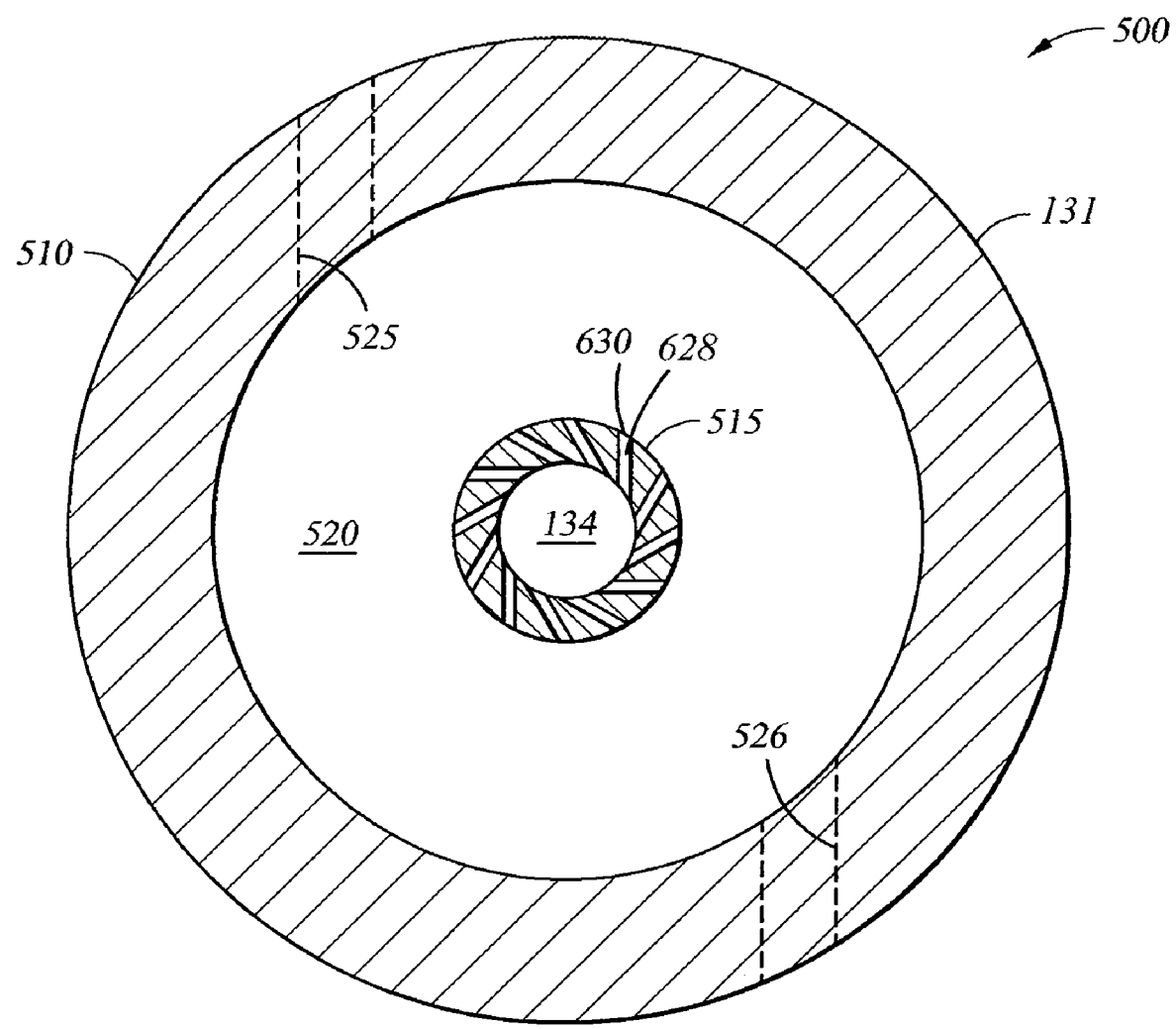

FIG. 6A is a schematic horizontal sectional view of an alternative embodiment of the second gas delivery system 500. In this embodiment, a plurality of tangentially disposed passageways 628 and nozzles 630 are formed within the inner wall 515 of the radial mixer 510 to provide a directional flow along an inner diameter of the expanding conduit 134. The nozzles 630 are preferably angled in the same direction to provide a clockwise flow pattern of the gases flowing therethrough. The directional flow provides a swirling effect that encourages mixing of the gases and attracts the flowing gases to the inner diameter of inner wall 134A of the expanding conduit 134, delivering a full distribution of mixed gases to the substrate 110.

Figure 7:
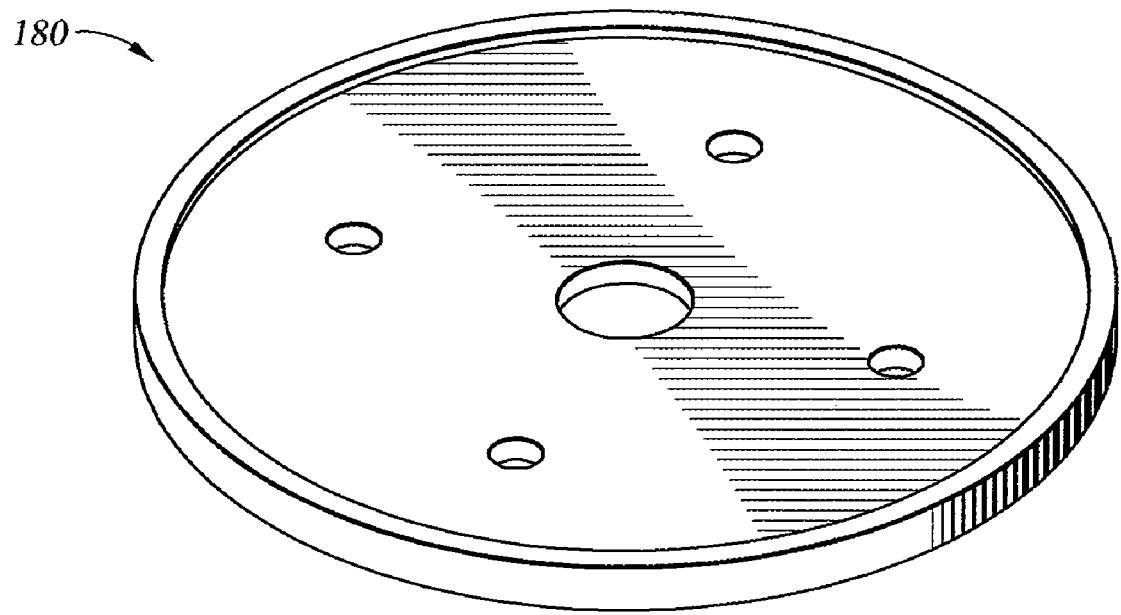
FIG. 7 is an isometric view of an exemplary thermal insulating plate 180 suitable for embodiments of the processing system 100 described herein.

FIG. 7 shows an isometric view of an exemplary thermal insulating plate 180 suitable for embodiments of the processing system 100 described herein. The thermal insulating plate 180 is an annular member that is disposed about the expanding conduit 134 between the head assembly 131 and the chamber lid 132, as depicted in FIGS. 1, 2, and 4. The thermal insulating plate 180 thermally confines or isolates the head assembly 131 from the chamber lid 132, and is preferably made from a material, such as stainless steel for example, that has a low heat transfer coefficient. A material that is a poor thermal conductor is preferred, so as to thermally insulate the head assembly 131 from the rest of the processing system 100, such as the chamber body 102 and the chamber lid 132 to achieve better temperature control and better overall operability.

Figure 7A:
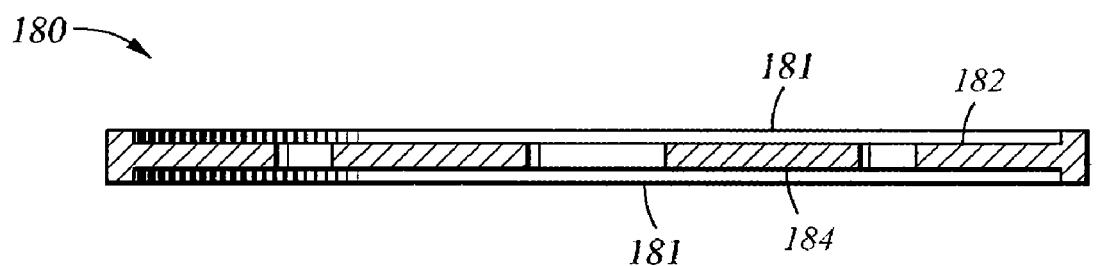
FIG. 7A is a cross sectional view of one exemplary design of the thermal insulating plate 180.

FIG. 7A shows a cross sectional view of one exemplary design of the thermal insulating plate 180. In this embodiment, a recess 181 is formed in both an upper surface 182 and a lower surface 184 of the thermal insulating plate 180 to minimize the surface area of the thermal insulating plate 180 that would otherwise be in contact with the head assembly 131 and the chamber lid 132. The reduction of surface area further reduces heat transfer between the components. Consequently, the head assembly 131 remains relatively unaffected by the temperature of the chamber lid 132. Likewise, the chamber lid 132 remains relatively unaffected by the temperature of the head assembly 131. As a result, the temperature of the chamber lid 132 is easier to maintain since less heat/energy is being transferred across the thermal insulating plate 180.

Referring again to FIG. 1, the processing system 100 may further include a controller 170, such as a programmed personal computer, work station computer, or the like, to control processing conditions. For example, the controller 170 may be configured to control flow of various process gases, carrier gases and purge gases through the valves 140A, 140B during different stages of a substrate process sequence. The controller 170 includes a processor 172 in data communication with memory, such as random access memory 174 and a hard disk drive 176. Typically, the controller 170 is in communication with at least the pump system 118, lift motor 114, valves 140A, 140B, and the power source (not shown). In addition, the controller 170 may be configured to be responsible for automated control of other activities used in wafer processing—such as wafer transport, temperature control, chamber evacuation, among other activities, some of which are described elsewhere herein. An exemplary controller 170 is a chamber/application specific controller, such as a programmable logic computer (PLC) which is described in more detail in the commonly assigned U.S. Ser. No. 09/800,881, filed on Mar. 7, 2001, and issued as U.S. Pat. No. 6,734,020, which is incorporated by reference herein.

The processing system 100 may be operated to perform chemical vapor deposition, cyclical layer deposition, atomic layer deposition, digital chemical vapor deposition, and rapid chemical vapor deposition techniques. The terms "cyclical layer deposition," "atomic layer deposition," "digital chemical vapor deposition," and "rapid chemical vapor deposition" are used interchangeably herein and refer to gas phase deposition techniques whereby two or more compounds are sequentially introduced into a reaction zone of a processing chamber to deposit a thin layer of material on a substrate surface.

A "substrate surface," as used herein, refers to any substrate surface upon which film processing is performed. For example, a substrate surface may include silicon, silicon oxide, doped silicon, germanium, gallium arsenide, glass, sapphire, and any other materials such as metals, metal alloys, and other conductive materials, depending on the application. A substrate surface may also include dielectric materials such as silicon dioxide and carbon doped silicon oxides.

The term "compound" is intended to include one or more precursors, oxidants, reductants, reactants, and catalysts, or combinations thereof. The term "compound" is also intended to include a grouping of compounds, such as when two or more compounds are introduced in a processing system at the same time. For example, a grouping of compounds may include one or more catalysts and one or more precursors. The term "compound" is further intended to include one or more precursors, oxidants, reductants, reactants, and catalysts, or a combination thereof in an activated or otherwise energized state, such as by disassociation or ionization. A wide variety of semiconductor processing precursors, compounds and reactants may be used. Examples may include titanium tetrachloride ($TiCl_4$), tungsten hexafluoride ($WF_6$), tantalum pentachloride ($TaCl_5$), titanium iodide ($TiI_4$), titanium bromide ($TiBr_4$), tetrakis(dimethylamido) titanium (TDMAT), pentakis(dimethylamido) tantalum (PDMAT), tetrakis(diethylamido) titanium (TDEAT), tungsten hexacarbonyl ($W(CO)_6$), tungsten hexachloride ($WCl_6$), pentakis(ethylmethylamido) tantalum (PEMAT), pentakis(diethylamido) tantalum (PDEAT), ammonia ($NH_3$), hydrazine ($N_2H_4$), monomethylhydrazine ($CH_3N_2H_3$), dimethylhydrazine ($C_2H_6N_2H_2$), t-butylhydrazine ($C_4H_9N_2H_3$), phenylhydrazine ($C_6H_5N_2H_3$), 2,2'-azotertbutane (($CH_3)_6C_2N_2$), ethylazide ($C_2H_5N_3$), and nitrogen ($N_2$), for example.

Each compound is separated by a time delay/pause to allow each compound to adhere and/or react on the substrate surface. The delays are advantageously adjusted to allow adsorption or reaction of a previously pulsed compound. A delay may also be adjusted to allow one or more treatment processes to proceed, such as annealing, densification, and nitrification for example. In one aspect, a first compound or compound A is dosed/pulsed into the reaction zone followed by a first time delay/pause. Next, a second compound or compound B is dosed/pulsed into the reaction zone followed by a second time delay. When a ternary material is desired, such as titanium silicon nitride, for example, a third compound (C), is dosed/pulsed into the reaction zone followed by a third time delay. These sequential tandems of a pulse of reactive compound followed by a time delay may be repeated indefinitely until a desired film or film thickness is formed on the substrate surface.

A "pulse" or "dose" as used herein in intended to refer to a quantity of a particular compound that is intermittently or non-continuously introduced into a reaction zone of the processing chamber. The quantity of a particular compound within each pulse may vary over time, depending on the duration of the pulse. A particular compound may include a single compound or a mixture/combination of two or more compounds. However, a continuous flow of a particular compound is also contemplated by the present invention as described herein and thus, is not outside the scope thereof.

A "reaction zone" is intended to include any volume that is in fluid communication with a substrate surface being processed. The reaction zone may include any volume within a processing chamber that is between a gas source and the substrate surface. For example, the reaction zone includes any volume downstream of a dosing valve in which a substrate is disposed.

The durations for each pulse/dose are variable and may be adjusted to accommodate, for example, the volume capacity of the processing chamber as well as the capabilities of a vacuum system coupled thereto. Additionally, the dose time of a compound may vary according to the flow rate of the compound, the pressure of the compound, the temperature of the compound, the type of dosing valve, the type of control system employed, as well as the ability of the compound to adsorb onto the substrate surface. Dose times may also vary based upon the type of layer being formed and the geometry of the device. In general, a dose time should be long enough to provide a volume of compound sufficient to adsorb/chemisorb onto substantially the entire surface of the substrate and form a layer of the desired thickness of the compound thereon.

It is believed that the surface attraction used to physisorb, adsorb, absorb, or chemisorb a monolayer of reactants on a substrate surface are self-limiting in that only one monolayer may be deposited onto the substrate surface during a given pulse because the substrate surface has a finite number of sites available for the reactants. Once the finite number of sites is occupied by the reactants, further deposition of the reactants will be blocked. The cycle may be repeated to a desired thickness of the tantalum nitride layer.

For simplicity and ease of description, however, the processing system 100 will be further described below, in operation, as it can be employed to deposit, in-situ, a barrier layer by cyclical layer deposition (CLD) and an adhesion layer by chemical vapor deposition (CVD). One or more metal-containing films, such as aluminum, copper, titanium, tungsten, nitrides thereof, oxides thereof, and combinations thereof may be deposited within the processing system 100. For example, the barrier layer may include one or more refractory metals, such as tungsten, titanium, and tantalum, for example. The barrier layer may also include one or more refractory metal nitrides, such as tungsten nitride, titanium nitride, and tantalum nitride, for example. The barrier layer may further include a ternary material, such as titanium silicon nitride and tantalum silicon nitride, for example. Similarly, the adhesion layer may include aluminum, copper, tungsten, alloys thereof, nitrides thereof, oxides thereof, and alloys thereof, for example.

In a CLD mode, one or more metal-containing precursors and one or more reductants are cyclically introduced into the expanding conduit 134 via the valves 140A, 140B, while a carrier or purge gas flows into the expanding conduit 134 via the nozzles 530. The carrier or purge gas may be introduced as a continuous flow or as one or more separately initiated flows, such as one or more pulses for example, between each pulse of the deposition compounds.

It is perceived to have as many different carrier or purge gases, whether continuous or pulsed, as there are deposition compounds. In other words, each deposition compound may utilize its own carrier or purge gas, whether continuous and/or pulsed. Alternatively, a single carrier or purge gas, whether continuous and/or pulsed, may be all that is needed.

Each carrier or purge gas, whether continuous or pulsed, may contain a single gas or a mixture/combination of two or more gases. The gases may be non-reactive with the compounds introduced for the purpose of deposition on the wafer. Alternatively, the gases may be reactive with one another or reactive with one or more of the compounds introduced for the purpose of deposition to form intermediate compounds, reactive compounds, and/or non-depositing compounds, for example. Exemplary gases include argon, helium, nitrogen, oxygen, and hydrogen.

In a CVD mode, one or more metal-containing precursors are introduced into the expanding conduit 134 via the nozzles 530, while a purge gas flows into the expanding conduit 134 via the valves 140A, 140B. A suitable purge gas may include hydrogen, helium, nitrogen, argon, or combinations thereof, for example. The purge gas flows into the expanding conduit 134 via the valves 140A, 140B or via the nozzles 530, whichever is not in use for the precursor gases, to prevent back flow, control deposition temperature, assist mixing of the deposition gases, and assist distribution of the deposition gases. Regarding back flow, the purge gas provides a positive pressure within the gas delivery assembly 130 to direct the deposition gases towards a lower pressure, and creates a pressure differential that isolates the valves 140A, 140B from the nozzles 530 during deposition. The term "deposition gas" as used herein includes one or more precursors, reductants, reactants, and catalysts. Each "deposition gas" may be a single compound or a mixture/combination of two or more compounds.

To further illustrate embodiments of the invention, an exemplary process of depositing a tantalum nitride (TaN) barrier layer using a CLD technique is described. First, a substrate 110 to be processed is positioned on the substrate support 112 within the chamber body 102. Next, argon gas is flowed into the processing system 100 via the nozzles 530 and the valves 140A, 140B to stabilize the temperature and pressure therein. One or more pulses of a tantalum-containing compound are then alternately introduced into the expanding conduit 134 via the first valve 140A with one or more pulses of a nitrogen-containing compound, introduced into the expanding conduit 134 via the second valve 140B. Simultaneously therewith, a purge gas, such as argon for example, is flowed through the annular mixing channel 520 into the expanding conduit 134.

The first valve 140A regulates the one or more pulses of the tantalum-containing compound into the expanding conduit 134 at a flow rate between about 100 sccm and about 1,000 sccm, preferably between about 100 sccm and about 400 sccm. Each pulse has a duration of about 0.5 seconds or less, about 0.1 seconds or less, or about 0.05 seconds or less. The second valve 140B regulates the one or more pulses of the nitrogen-containing compound into the expanding conduit 134 at a flow rate between about 100 sccm and about 1,000 sccm, preferably between about 200 sccm and about 600 sccm, for a pulse time of about 0.5 seconds or less, about 0.1 seconds or less, or about 0.05 seconds or less. The time between pulses of the tantalum-containing compound and the nitrogen-containing compound may be about 0.5 seconds or less, about 0.1 seconds or less, or about 0.07 seconds or less. This process forms a tantalum nitride layer having a thickness between about 0.5 Å and about 1.0 Å per cycle. The alternating sequence is then repeated until a desired thickness is achieved, such as about 1,000 Å or less, preferably about 20 Å or less, and more preferably about 10 Å.

The tantalum-containing compound and the nitrogen-containing compound flow through the expanding conduit 134 within the vortex flow pattern 402A, 402B, resembling a sweeping action across the inner surface of the expanding conduit 134. The vortex flow pattern 402A, 402B dissipates to a downward flow pattern 404 toward the surface of the substrate 110. The gases then flow across the bottom surface 160 of the chamber lid 132 and across the surface of the substrate 110. The bottom surface 160 of the chamber lid 132, which is downwardly sloping, helps reduce the variation of the velocity of the gas flow across the surface of the substrate 110. Finally, the gases flow from the chamber body 102 into the pump system 118 via the apertures 162A formed in the pumping plate 162.

The argon purge gas is introduced from the second gas delivery sub-assembly 500 at a flow rate between about 100 sccm and about 1000 sccm, preferably, between about 100 sccm and about 400 sccm. The argon purge gas flows along the inner surfaces of the expanding conduit 134 to prevent condensation or deposition thereon. The purge gas also shields or isolates the deposition gases from the temperature of the walls of the expanding conduit 134 and the chamber lid 132, allowing better control of the deposition conditions. The isolation of the deposition gases from the walls of the expanding conduit 134 and the chamber lid 132 also helps prevent decomposition of the precursor gases if the walls are at a high temperature. Further, the purge gas helps to mix the tantalum-containing compound and the nitrogen-containing compound passing through the expanding conduit 134. Still further, the purge gas prevents back-flow of the deposition gases into the annular mixing channel 520.

Any tantalum-containing compound and nitrogen-containing compound may be used to form the barrier layer according to the embodiments above. For example, some exemplary tantalum-containing compounds include: t-butylimino tris (diethylamino) tantalum (TBTDET), pentakis(ethylmethylamino), tantalum (PEMAT), pentakis(dimethylamino) tantalum (PDMAT), pentakis(diethylamino) tantalum (PDEAT), t-butylimino tris(methylethylamino) tantalum (TBTMET), t-butylimino tris(dimethylamino) tantalum (TBTDMT), bis (cyclopentadienyl) tantalum trihydride ($(Cp)_2TaH_3$), bis(methylcyclopentadienyl) tantalum trihydride ($(CpMe)_2TaH_3$), derivatives thereof, and combinations thereof. Additionally, some exemplary nitrogen-containing compounds include ammonia, hydrazine, methylhydrazine, dimethylhydrazine, t-butylhydrazine, phenylhydrazine, azoisobutane, ethylazide, derivatives thereof, and combinations thereof.

It is to be understood that these compounds or any other suitable compound not listed above may be a solid, liquid, or gas at room temperature. For example, PDMAT is a solid at room temperature and TBTDET is a liquid at room temperature. Accordingly, the non-gas phase precursors are subjected to a sublimation or vaporization step, which are both well known in the art, prior to introduction into the processing chamber. A carrier gas, such as argon, helium, nitrogen, hydrogen, or a mixture thereof, may also be used to help deliver the compound into the processing chamber, as is commonly known in the art.

An exemplary process for forming a TaN barrier layer on a 200 mm wafer using a cyclical deposition process of alternate/sequential pulses of penta(dimethylamino) tantalum (PDMAT) and ammonia is described below. PDMAT is a preferred tantalum-containing compound for a number of reasons. PDMAT is relatively stable, and has a vapor pressure which makes it easy to deliver. PDMAT may also be produced with a low halide content, such as less than 100 ppm, and may even be produced with a halide content of less than 30 ppm or even less than 5 ppm.

To deposit the TaN layer, an inert/purge gas such as argon is first introduced into the expanding conduit 134 via the valves 140A, 140B and the nozzles 530 to stabilize the pressure and temperature within the chamber body 102. The argon gas will continuously flow through the valves 140A, 140B during the deposition process such that only the argon gas flows between pulses of PDMAT and ammonia. Likewise, the argon continuously flows through the nozzles 530 during the deposition process.

After the chamber pressure and temperature have been stabilized between about 200° C. and about 300° C. at about 1 Torr to about 5 Torr, a first pulse of PDMAT is provided to the expanding conduit 134 via the first valves 140A at a flow rate between about between about 100 sccm and about 400 sccm, with a pulse time of about 0.6 seconds or less. A pulse of ammonia is then provided to the expanding conduit 134 via the second valve 140B at a flow rate between about 200 sccm and about 600 sccm, with a pulse time of about 0.6 seconds or less.

A pause between pulses of PDMAT and ammonia is about 1.0 second or less, about 0.5 seconds or less, or about 0.1 seconds or less. A pause after the pulse of ammonia is also about 1.0 second or less, about 0.5 seconds or less, or about 0.1 seconds or less. The argon gas flows between about 100 sccm and about 1,000 sccm, such as between about 100 sccm and about 400 sccm, through each valve 140A, 140B. In one aspect, at least a portion of a pulse of PDMAT may still be in the reaction zone when at a least a portion of a pulse of ammonia enters so that some co-reaction or gas phase co-reaction takes place. In another aspect, the duration of the purge gas and/or pump evacuation is designed to prevent the pulses of PDMAT and ammonia from mixing together in the reaction zone.

The substrate temperature is maintained between about 100° C. and about 300° C. at a chamber pressure between about 1.0 Torr and about 5.0 Torr. Each cycle consisting of a pulse of PDMAT, pause, pulse of ammonia, and pause provides a tantalum nitride layer having a thickness between about 0.3 Å and about 1.0 Å per cycle. The alternating sequence is repeated until the desired thickness is achieved, which is less than about 20 Å, such as about 10 Å. Accordingly, the deposition method requires between 10 and 70 cycles, more typically between 20 and 30 cycles.

Referring to the CVD mode to deposit the adhesion layer, a purge gas flows through the valves 140A, 140B while the deposition gases flow through the nozzles 530 into the expanding conduit 134. The adhesion layer may contain any type of material that are known in the art or yet to be discovered. However, for simplicity and ease of description, the invention will be further described in reference to depositing an adhesion layer containing aluminum.

Useful aluminum-containing precursors include dimethyl aluminum hydride (DMAH) and trimethyl aluminum (TMA), for example. While the adhesion layer may be deposited under various conditions, a typical process involves a wafer temperature between about 150° C. and about 300° C. at a pressure of about 1 Torr to about 80 Torr. The deposition rate is usually about 20 Å/sec to about 150 Å/sec.

In one aspect, DMAH flows through the first gas inlet 525 into the annular mixing channel 520 at a rate between about 100 sccm and about 2,000 sccm while a reducing gas, such as hydrogen for example, flows through the second gas inlet 526 into the annular mixing channel 520 at a rate between about 100 sccm and about 2,000 sccm. The two deposition gases mix within the annular mixing channel 520 before they flow evenly through the nozzles 530 into the expanding conduit 134.

During the CVD mode, a purge gas, such as argon for example, flows through the valves 140A, 140B into the expanding conduit 134 to promote mixing and to better distribute the DMAH and hydrogen gases across the surface of the substrate 110. The purge gas also prevents backflow of the deposition gases (DMAH and hydrogen) into the valves 140A, 140B. In one aspect, the valves 140A, 140B may pulse the argon gas into the expanding conduit 134 to create a wave-like effect. The wave-like effect is thought to pulsate the deposition gases providing better mixing. In another aspect, the valves 140A, 140B may be left "on" to deliver a continuous flow of argon into the expanding conduit 134.

Figure 8A:
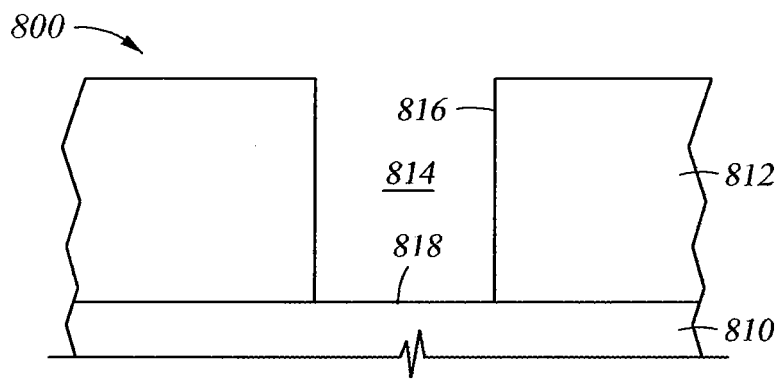
FIGS. 8A-8D are schematic representations of an exemplary interconnect structure 800 at different stages of fabrication.
Figure 8B:
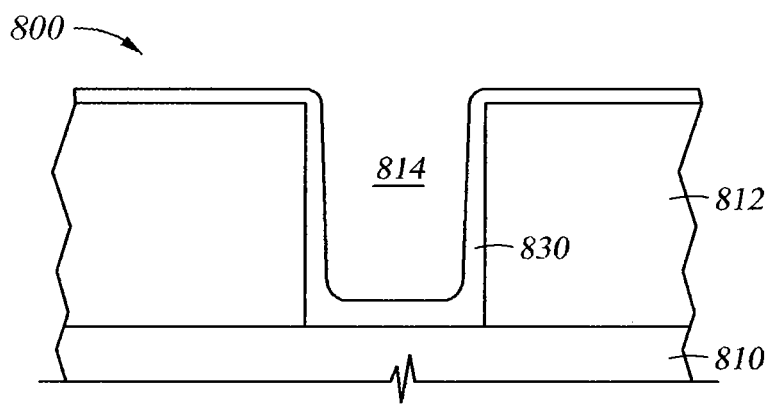
Figure 8C:
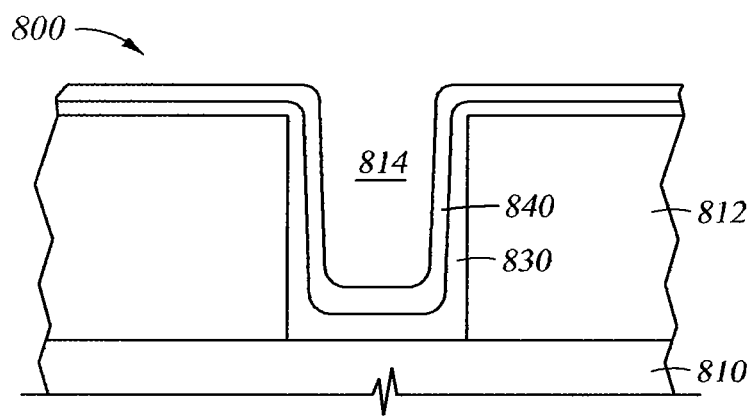
Figure 8D:
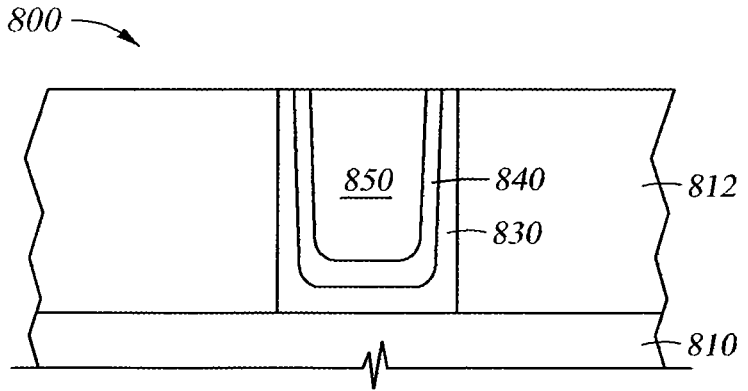

FIGS. 8A-8D are schematic representations of an exemplary interconnect structure 800 at different stages of fabrication and are presented to illustrate an exemplary fabrication process according to embodiments described herein. FIG. 8A shows an underlying metal layer 810 having a dielectric layer 812 formed thereon. The underlying metal layer 810 may contain any conductive metal such as aluminum, copper, tungsten, or combinations thereof, for example, and may form part of an interconnect feature such as a plug, via, contact, line, wire, and may also be part of a metal gate electrode. FIG. 8B shows a barrier layer 830 at least partially deposited on the underlying metal layer 810. FIG. 8C shows an adhesion layer 840 at least partially deposited on the barrier layer 830, and FIG. 8D shows a bulk metal layer 850 at least partially deposited on the adhesion layer 840.

Referring to FIG. 8A, the dielectric layer 812 may be any dielectric material including a low k dielectric material (k≦4.0), whether presently known or yet to be discovered. For example, the dielectric layer 812 may be a silicon oxide or a carbon doped silicon oxide, for example. The dielectric layer 812 has been etched to form a feature 814 therein using conventional and well-known techniques. The feature 814 may be a plug, via, contact, line, wire, or any other interconnect component. Typically, the feature 814 has vertical sidewalls 816 and a floor 818, having an aspect ratio of about 4:1 or greater, such as about 6:1. The floor 818 exposes at least a portion of the lower level metal interconnect, such as the underlying metal layer 810.

Referring to FIG. 8B, the barrier layer 830 is conformally deposited on the floor 818 as well as the sidewalls 816 of the feature 814 using a CLD technique. Preferably, the barrier layer 830 includes tantalum nitride and is deposited as described above within the processing system 100.

Prior to depositing the barrier layer 830, the patterned or etched substrate dielectric layer 812 may be cleaned to remove native oxides or other contaminants from the surface thereof. For example, reactive gases are excited into a plasma within a remote plasma source chamber, such as a Reactive Pre-clean chamber, available from Applied Materials, Inc., located in Santa Clara, Calif. Pre-cleaning may also be done within a metal CVD or PVD chamber by connecting the remote plasma source thereto. Alternatively, metal deposition chambers having gas delivery systems could be modified to deliver the pre-cleaning gas plasma through existing gas inlets such as a gas distribution showerhead positioned above the substrate.

In one aspect, the reactive pre-clean process forms radicals from a plasma of one or more gases such as argon, helium, hydrogen, nitrogen, fluorine-containing compounds, and combinations thereof. For example, the gas may include a mixture of tetrafluorocarbon ($CF_4$) and oxygen ($O_2$), or a mixture of helium and nitrogen trifluoride ($NF_3$). More preferably, the gas is a mixture of helium and nitrogen trifluoride.

Following the argon plasma, the chamber pressure is increased to about 140 mTorr, and a processing gas consisting essentially of hydrogen and helium is introduced into the processing region. Preferably, the processing gas contains about 5% hydrogen and about 95% helium. The hydrogen plasma is generated by applying between about 50 watts and about 500 watts power. The hydrogen plasma is maintained for about 10 seconds to about 300 seconds.

An adhesion layer 840 is then deposited on the barrier layer 830 using a CVD technique. The adhesion layer 840 may include aluminum deposited according to embodiments described above. After the adhesion layer 840 is deposited, the substrate 800 may then be transferred into a separate processing chamber to complete the metallization by depositing the metal layer 850 shown in FIG. 8D.

Alternatively, the metal layer 850 may be deposited within the processing system 100 without a need to transfer the substrate 800 if the metal layer 850 is to be deposited using a CLD or CVD technique. Most often, the metal layer 850 is copper and deposited using PVD, electroplating, or electroless techniques. Preferably, a metal layer 850 of copper is formed within an electroplating cell, such as the ELECTRA CU® ECP system, available from Applied Materials, Inc., of Santa Clara, Calif. The ELECTRA CU® ECP system may also be integrated into an ENDURA® platform also available from Applied Materials, Inc.

A copper electrolyte solution and copper electroplating technique is described in commonly assigned U.S. Pat. No. 6,113,771, which is incorporated by reference herein. Typically, the electroplating bath has a copper concentration greater than about 0.7 M, a copper sulfate concentration of about 0.85 M, and a pH of about 1.75. The electroplating bath may also contain various additives as is well known in the art. The temperature of the bath is between about 15° C. and about 25° C. The bias is between about −15 volts to about 15 volts. In one aspect, the positive bias ranges from about 0.1 volts to about 10 volts and the negatives bias ranges from about −0.1 volts to about −10 volts.

Optionally, an anneal treatment may be performed following the metal layer 850 deposition whereby the substrate is subjected to a temperature between about 100° C. and about 400° C. for about 10 minutes to about 1 hour, preferably about 30 minutes. A carrier/purge gas such as helium, hydrogen, nitrogen, or a mixture thereof is introduced at a rate of about 100 sccm to about 10,000 sccm. The chamber pressure is maintained between about 2 Torr and about 10 Torr. The RF power is about 200 watts to about 1,000 watts at a frequency of about 13.56 MHz, and the preferable substrate spacing is between about 300 mils and about 800 mils.

Following metallization, the top portion of the resulting structure may be planarized. A chemical mechanical polishing (CMP) apparatus may be used, such as the MIRRA® System available from Applied Materials, Inc., Santa Clara, Calif., for example. Optionally, the intermediate surfaces of the structure may be planarized between the deposition of the subsequent layers described above.

Figure 9:
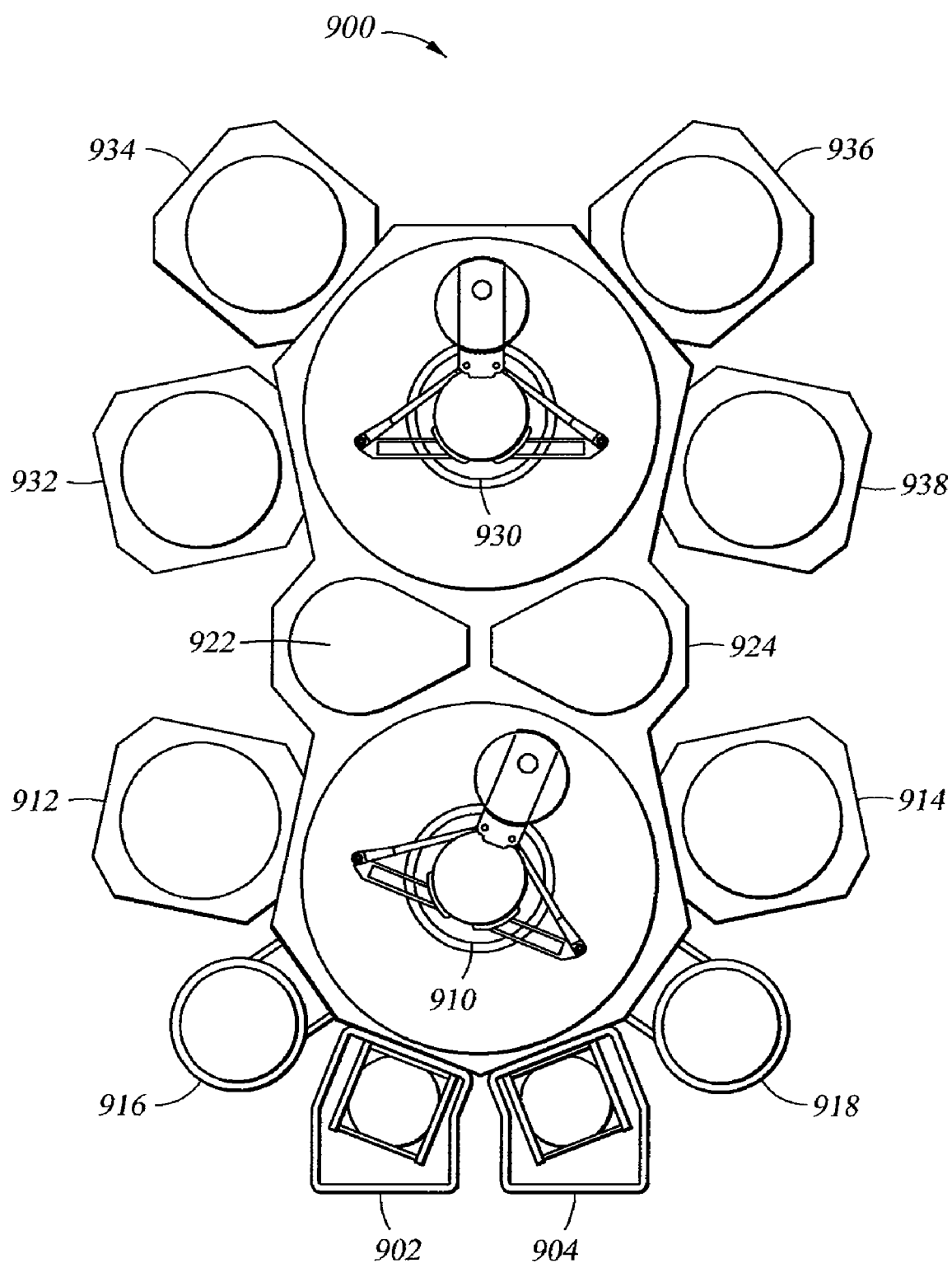
FIG. 9 is a schematic top-view diagram of an exemplary multi-chamber processing system 900 that is adapted to perform the multiple deposition processes disclosed herein.

FIG. 9 is a schematic top-view diagram of an exemplary multi-chamber processing system 900 that may be adapted to perform the fabrication sequence described above. Such a processing system 900 may be an ENDURA® system, commercially available from Applied Materials, Inc., of Santa Clara, Calif. A similar multi-chamber processing system is disclosed in U.S. Pat. No. 5,186,718, which is incorporated by reference herein.

The system 900 generally includes two or more load lock chambers 902, 904, two or more transfer chambers 922, 924, two or more transfer robots 910, 930, and a plurality of processing chambers 912, 914, 916, 918, 932, 934, 936, 938, disposed thereon. The load lock chambers 902, 904 transfer substrates into and out of the system 900. Typically, since the system 900 is under vacuum, the load lock chambers 902, 904 "pump down" the substrates introduced into the system 900.

A first robot 910 may transfer the substrates between the load lock chambers 902, 904, and a first set of one or more substrate processing chambers 912, 914, 916, 918 (four are shown). Each processing chamber 912, 914, 916, 918, has the capability of performing a dual deposition process therein, such as CLD and CVD as described above. Alternatively, each processing chamber 912, 914, 916, 918, can be outfitted to perform a number of single processing operations, such as cyclical layer deposition, CVD, PVD, etch, annealing, preclean, degas, orientation and other substrate processes.

The first robot 910 also transfers substrates to/from the one or more transfer chambers 922, 924. The transfer chambers 922, 924, are used to maintain ultrahigh vacuum conditions while allowing substrates to be transferred within the system 900. A second robot 930 may transfer the substrates between the transfer chambers 922, 924 and a second set of one or more processing chambers 932, 934, 936, and 938.

Similar to processing chambers 912, 914, 916, and 918, the processing chambers 932, 934, 936, and 938, have the capability of performing a dual deposition process therein, such as CLD and CVD as described above. Alternatively, the processing chambers 932, 934, 936, and 938 can be outfitted to perform a variety of single processing operations, such as cyclical layer deposition, CVD, PVD, etch, anneal, pre-clean, degas, and orientation, for example. Any of the substrate processing chambers 912, 914, 916, 918, 932, 934, 936, and 938 may be removed from the system 900 if not necessary for a particular process to be performed by the system 900.

In a particular arrangement, the processing chambers 932, 934, 936 and 938 are a dual CLD and CVD processing system, as described above, adapted to deposit a barrier layer in a CLD mode followed by depositing an adhesion layer in a CVD mode. The processing chambers 912 and 914 may be a physical vapor deposition chamber, a chemical vapor deposition chamber, or a cyclical deposition chamber adapted to deposit a dielectric layer. The processing chambers 916 and 918 may be etch chambers outfitted to etch apertures or openings for interconnect features. This one particular arrangement of the system 900 is provided for illustrative purposes only and should not be used to limit the scope of the invention.

While the foregoing is directed to embodiments of the invention, other and further embodiments of the invention may be devised without departing from the basic scope thereof, and the scope thereof is determined by the claims that follow.

The invention claimed is:

1. An apparatus for performing an atomic layer deposition process, comprising:
    a chamber body comprising a substrate support;
    a lid assembly attached to the chamber body;
    a reaction zone between the lid assembly and the substrate support;
    a remote plasma system in fluid communication with the reaction zone;
    a centralized conduit extending through the lid assembly;
    a first gas delivery sub-assembly on the lid assembly and configured to deliver a first process gas into the centralized conduit, wherein the first as delivery sub-assembly comprises a first delivery conduit in fluid communication to the centralized conduit; and
    a second gas delivery sub-assembly on the lid assembly and configured to deliver a second process gas, comprising:
        an annular channel encircling and in fluid communication with the centralized conduit, wherein the annular channel is adapted to deliver the second process gas through a plurality of passageways and nozzles and into the centralized conduit; and
        a first gas inlet and a second gas inlet coupled to the annular channel and positioned to provide the second process gas to the annular channel and wherein the first gas delivery sub-assembly is positioned above the second gas delivery sub-assembly.

2. The apparatus of claim 1, further comprising a second gas delivery conduit in fluid communication with the centralized conduit.

3. The apparatus of claim 2, further comprising a first high speed actuating valve in fluid communication with the first delivery conduit and a second high speed actuating valve in fluid communication with the second delivery conduit.

4. The apparatus of claim 1, wherein the plurality of nozzles is radially positioned or substantially radially positioned relative to the centralized conduit.

5. The apparatus of claim 1, wherein the plurality of nozzles is tangentially positioned or substantially tangentially positioned relative to the centralized conduit.

6. The apparatus of claim 1, wherein the plurality of nozzles is positioned at an angle relative to normal between about −60° to about +60°.

7. The apparatus of claim 1, wherein the centralized conduit includes one or more tapered surfaces.

8. The apparatus of claim 1, wherein a lower edge of the centralized conduit is chamfered.

9. The apparatus of claim 1, wherein the second gas inlet is positioned with the first gas inlet to form the circular gas flow pattern.

10. The apparatus of claim 9, wherein the circular gas flow pattern is selected from the group consisting of a vortex pattern, a spiral pattern and a derivative thereof.

11. The apparatus of claim 3, wherein the first and second high speed actuating valves are independently configured to enable pulses of gases with a pulse time of about 1 second or less.

\* \* \* \* \*

UNITED STATES PATENT AND TRADEMARK OFFICE
CERTIFICATE OF CORRECTION

| | | |
|---|---|---|
| PATENT NO. | : 8,070,879 B2 | |
| APPLICATION NO. | : 12/544729 | |
| DATED | : December 6, 2011 | |
| INVENTOR(S) | : Chen et al. | |

It is certified that error appears in the above-identified patent and that said Letters Patent is hereby corrected as shown below:

In the Claims:

Column 17, Claim 1, Line 43, please delete "as" and insert --gas-- therefor.

Signed and Sealed this
Twenty-first Day of February, 2012

David J. Kappos
*Director of the United States Patent and Trademark Office*